United States Patent
Yi et al.

(10) Patent No.: US 11,195,894 B2
(45) Date of Patent: Dec. 7, 2021

(54) DISPLAY APPARATUS

(71) Applicant: SAMSUNG DISPLAY CO., LTD., Yongin-si (KR)

(72) Inventors: Junghun Yi, Yongin-si (KR); Seungkyu Lee, Yongin-si (KR); Wonkyu Kwak, Yongin-si (KR); Wonse Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/027,917

(22) Filed: Sep. 22, 2020

(65) Prior Publication Data
US 2021/0005694 A1    Jan. 7, 2021

Related U.S. Application Data

(63) Continuation of application No. 16/178,846, filed on Nov. 2, 2018, now Pat. No. 10,784,328.

(30) Foreign Application Priority Data

Nov. 2, 2017 (KR) .......................... 10-2017-0145375

(51) Int. Cl.
*H01L 27/32* (2006.01)
*H01L 27/12* (2006.01)
(Continued)

(52) U.S. Cl.
CPC ....... *H01L 27/3262* (2013.01); *G09G 3/3225* (2013.01); *H01L 27/124* (2013.01); (Continued)

(58) Field of Classification Search
CPC . H01L 27/124; H01L 27/326; H01L 27/1222; H01L 27/1255; H01L 27/3218; (Continued)

(56) References Cited

U.S. PATENT DOCUMENTS

2003/0137255 A1* 7/2003 Park ..................... H01L 27/3244
315/169.3
2011/0291088 A1 12/2011 Seo et al.
(Continued)

FOREIGN PATENT DOCUMENTS

EP         3401896       11/2018
KR  10-2013-0068714      6/2013
(Continued)

OTHER PUBLICATIONS

Extended European Search Report dated Apr. 3, 2019 in corresponding European Application No. 18203635.0.
(Continued)

*Primary Examiner* — Peniel M Gumedzoe
(74) *Attorney, Agent, or Firm* — F. Chau & Associates, LLC

(57) ABSTRACT

A display apparatus is provided by the present invention, the display apparatus includes a first thin film transistor (TFT) disposed in a first pixel region and including a first semiconductor layer and a first gate electrode, where the semiconductor layer includes first source and drain regions; a second TFT disposed in a second pixel region adjacent the first pixel region and including a second semiconductor layer and a second gate electrode, where the second semiconductor layer includes a second source and drain regions; a first pixel electrode disposed in the first pixel region and including a first region where a first light-emitting layer is disposed and a second region extending from the first region and disposed on a first via hole; and a second pixel electrode disposed in the second pixel region and including a third region where a second light-emitting layer is disposed and a fourth region extending from the third region and disposed on a second via hole.

16 Claims, 9 Drawing Sheets

(51) Int. Cl.
*H01L 51/52* (2006.01)
*G09G 3/3225* (2016.01)
*G09G 3/3233* (2016.01)
*G09G 3/20* (2006.01)

(52) U.S. Cl.
CPC ...... *H01L 27/1222* (2013.01); *H01L 27/1255* (2013.01); *H01L 27/326* (2013.01); *H01L 27/3218* (2013.01); *H01L 27/3248* (2013.01); *H01L 27/3258* (2013.01); *H01L 27/3265* (2013.01); *H01L 27/3276* (2013.01); *H01L 51/5209* (2013.01); *H01L 51/5237* (2013.01); *H01L 51/5284* (2013.01); *G09G 3/2003* (2013.01); *G09G 3/3233* (2013.01); *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2310/0251* (2013.01); *H01L 27/3272* (2013.01)

(58) Field of Classification Search
CPC ............. H01L 27/3262; H01L 27/3276; H01L 27/3265; H01L 27/3258; H01L 27/3248; H01L 51/5209; H01L 51/5284; H01L 51/5237; G09G 3/3225
See application file for complete search history.

(56) References Cited

U.S. PATENT DOCUMENTS

| | | |
|---|---|---|
| 2013/0153939 A1 | 6/2013 | Lee et al. |
| 2014/0070184 A1 | 3/2014 | Shin |
| 2014/0292622 A1 | 10/2014 | Lee |
| 2015/0102320 A1 | 4/2015 | Jung |
| 2016/0204177 A1 | 7/2016 | Kim |
| 2016/0260792 A1 | 9/2016 | Kim et al. |
| 2016/0358995 A1 | 12/2016 | Kim et al. |
| 2017/0011685 A1 | 1/2017 | Jeon |
| 2017/0047390 A1 | 2/2017 | Lee et al. |
| 2017/0309228 A1 | 10/2017 | Matsueda et al. |
| 2019/0131371 A1 | 5/2019 | Yi et al. |

FOREIGN PATENT DOCUMENTS

| | | |
|---|---|---|
| KR | 10-2014-0035156 | 3/2014 |
| KR | 10-2016-0048744 | 5/2016 |

OTHER PUBLICATIONS

Office Action dated Feb. 6, 2020 in Corresponding U.S. Appl. No. 16/178,846.

\* cited by examiner

DISPLAY APPARATUS

CROSS-REFERENCE TO RELATED APPLICATIONS

This U.S. application is a continuation application of U.S. patent application Ser. No. 16/178,846 filed Nov. 2, 2018, which claims the benefit of priority under 35 U.S.C. § 119 to Korean Patent Application No. 10-2017-0145375, filed on Nov. 2, 2017, in the Korean Intellectual Property Office, the disclosures of which are incorporated herein in their entirety by reference.

BACKGROUND

1. Technical Field

The present disclosure relates to display apparatuses.

2. Discussion of Related Art

A display apparatus includes a display device and electronic devices used to control an electrical signal applied to the display device. The electronic devices include a thin film transistor, a capacitor, and a plurality of wirings.

In order to accurately control light emission of the display device and the degree of light emission thereof, there is a large number of thin film transistors electrically connected to the display device, and a large number of wirings through which an electrical signal is transmitted to the thin film transistors. However, the number of thin film transistors and wirings may reduce the display quality and the resolution of the display device.

SUMMARY

At least one embodiment of the inventive concept includes a display apparatus having improved display quality and resolution.

According to an exemplary embodiment of the inventive concept, a display apparatus includes: a first thin film transistor disposed in a first pixel region on a substrate and including a first semiconductor layer and a first gate electrode, wherein the first semiconductor layer includes a first source region and a first drain region; a second thin film transistor disposed in a second pixel region on the substrate adjacent to the first pixel region and including a second semiconductor layer and a second gate electrode, wherein the second semiconductor layer includes a second source region and a second drain region; a first pixel electrode disposed in the first pixel region and including a first region where a first light-emitting layer is disposed and a second region extending from the first region and disposed on a first via hole; and a second pixel electrode disposed in the second pixel region and including a third region where a second light-emitting layer is disposed and a fourth region extending from the third region and disposed on a second via hole, The first region of the first pixel electrode may overlap with at least one of the first source region and the first drain region of the first thin film transistor, and the fourth region of the second pixel electrode may overlap with at least one of the second source region and the second drain region of the second thin film transistor.

A size of the fourth region of the second pixel electrode may be greater than that of the second region of the first pixel electrode.

The third region of the second pixel electrode and the first region of the first pixel electrode may be diagonally spaced apart from each other.

The display apparatus may further include an insulating layer covering the second region of the first pixel electrode and the fourth region of the second pixel electrode.

The insulating layer may cover an edge of the first region of the first pixel electrode and an edge of the third region of the second pixel electrode.

The display apparatus may further include: a first driving thin film transistor and a first capacitor that are disposed in the first pixel region and connected to the first thin film transistor; and a second driving thin film transistor and a second capacitor that are disposed in the second pixel region and connected to the second thin film transistor.

The first region of the first pixel electrode may at least partially overlap with the first driving thin film transistor and the first capacitor, and the fourth region of the second pixel electrode may at least partially overlap with the second driving thin film transistor and the second capacitor.

The first capacitor may overlap with the first driving thin film transistor, and the second capacitor may overlap with the second driving thin film transistor.

The first capacitor may includes a first bottom electrode and a first top electrode, and the second capacitor may include a second bottom electrode and a second top electrode, wherein the first bottom electrode may be at least a portion of a gate electrode of the first driving thin film transistor, and the second bottom electrode may be at least a portion of a gate electrode of the second driving thin film transistor.

The display apparatus may further include: a first data line disposed in the first pixel region; a first switching thin film transistor connected to the first data line and the first driving thin film transistor; and a shielding member overlapping with at least one of a source region and a drain region of the first switching thin film transistor.

The shielding member may be disposed at a same level as the first top electrode.

The shielding member may be connected to a first power line that is electrically connected to the first top electrode.

The display apparatus may further include: a third thin film transistor disposed in a third pixel region adjacent to the second pixel region of the substrate, the third thin film transistor including a third semiconductor layer and a third gate electrode, wherein the third semiconductor layer includes a third source region and a third drain region; and a third pixel electrode disposed in the third pixel region, the third pixel electrode including a fifth region where a third light-emitting layer is disposed and a sixth region extending from the fifth region and disposed on a third via hole, wherein the fifth region of the third pixel electrode may overlap with at least one of the third source region and the third drain region of the third thin film transistor.

The display apparatus may include: a first driving thin film transistor in the first pixel region, the first driving thin film transistor being connected to the first thin film transistor via a first connection electrode; a second driving thin film transistor in the second pixel region, the second driving thin film transistor being connected to the second thin film transistor via a second connection electrode; and a third driving thin film transistor in the third pixel region, the third driving thin film transistor being connected to the third thin film transistor via a third connection electrode, wherein the first through third pixel electrodes respectively may overlap with the first through third connection electrodes.

At least one of the first through third connection electrodes may overlap with a corresponding region from among the first region, the third region, and the fifth region of the first through third pixel electrodes.

At least one of the first through third connection electrodes may overlap with a corresponding region from among the second region, the fourth region, and the sixth region of the first through third pixel electrodes.

The first pixel region, the second pixel region, and the third pixel region may respectively correspond to a red pixel region, a blue pixel region, and a green pixel region.

According to an exemplary embodiment of the inventive concept, a display apparatus includes: a first pixel circuit disposed in a first column on a substrate and including a first thin film transistor; a second pixel circuit disposed in a second column on the substrate adjacent to the first column and including a second thin film transistor; a first pixel electrode connected to the first pixel circuit; a second pixel electrode connected to the second pixel circuit; and a first insulating layer on the first pixel electrode and the second pixel electrode, the first insulating layer including a first opening exposing a portion of the first pixel electrode and a second opening exposing a portion of the second pixel electrode.

The first pixel electrode may include a first region corresponding to the first opening and a second region extending from the first region, and the second pixel electrode may include a third region corresponding to the second opening and a fourth region extending from the third region, and the first region of the first pixel electrode may at least partially overlap with the first thin film transistor, and the fourth region of the second pixel electrode may at least partially overlap with the second thin film transistor.

The display apparatus may further include a second insulating layer including a first via hole in the second region of the first pixel electrode and a second via hole in the fourth region of the second pixel electrode, wherein the second insulating layer is disposed between the first pixel circuit and the first pixel electrode and between the second pixel circuit and the second pixel electrode The first pixel circuit and the second pixel circuit may each include a driving thin film transistor, wherein the first thin film transistor may be connected to a gate electrode and one of a source region and a drain region of the driving thin film transistor of the first pixel circuit, and the second thin film transistor may be connected to a gate electrode and one of a source region and a drain region of the driving thin film transistor of the second pixel circuit.

The first region of the first pixel electrode may at least partially overlap with the driving thin film transistor of the first pixel circuit, and the fourth region of the second pixel electrode may at least partially overlap with the driving thin film transistor of the second pixel circuit.

The display apparatus may further include: a third pixel circuit disposed in a third column on the substrate adjacent to the second column and including a third thin film transistor; and a third pixel electrode connected to the third pixel circuit, wherein the first insulating layer may include a third opening exposing a portion of the third pixel electrode, wherein the third pixel electrode may include a fifth region corresponding to the third opening and a sixth region extending from the fifth region, and the fifth region of the third pixel electrode may at least partially overlap with the third thin film transistor.

The display apparatus may further include: a red light-emitting layer disposed in the first opening; a blue light-emitting layer disposed in the second opening; and a green light-emitting layer disposed in the third opening.

According to an exemplary embodiment of the inventive concept, a display apparatus includes: a first thin film transistor disposed in a first pixel region on a substrate and including a first semiconductor layer and a first gate electrode, wherein the first semiconductor layer comprises a first source region and a first drain region; a second thin film transistor disposed in a second pixel region on the substrate adjacent to the first pixel region and comprising a second semiconductor layer and a second gate electrode, wherein the second semiconductor layer comprises a second source region and a second drain region; a first pixel electrode disposed in the first pixel region and including a first region where a first light-emitting layer is disposed and a second region extending from the first region and disposed on a first via hole; and a second pixel electrode disposed in the second pixel region and including a third region where a second light-emitting layer is disposed and a fourth region extending from the third region and disposed on a second via hole, where a size of the fourth region of the second pixel electrode is greater than a size of the second region of the first pixel electrode.

The first region of the first pixel electrode may overlap with at least one of the first source region and the first drain region of the first thin film transistor, and the fourth region of the second pixel electrode may overlap with at least one of the second source region and the second drain region of the second thin film transistor.

The third region of the second pixel electrode and the first region of the first pixel electrode maybe diagonally spaced apart from each other.

BRIEF DESCRIPTION OF THE DRAWINGS

The inventive concept will become apparent and more readily appreciated from the following description of the embodiments therein, taken in conjunction with the accompanying drawings in which.

DETAILED DESCRIPTION OF THE EXEMPLARY EMBODIMENTS

Figure 1:
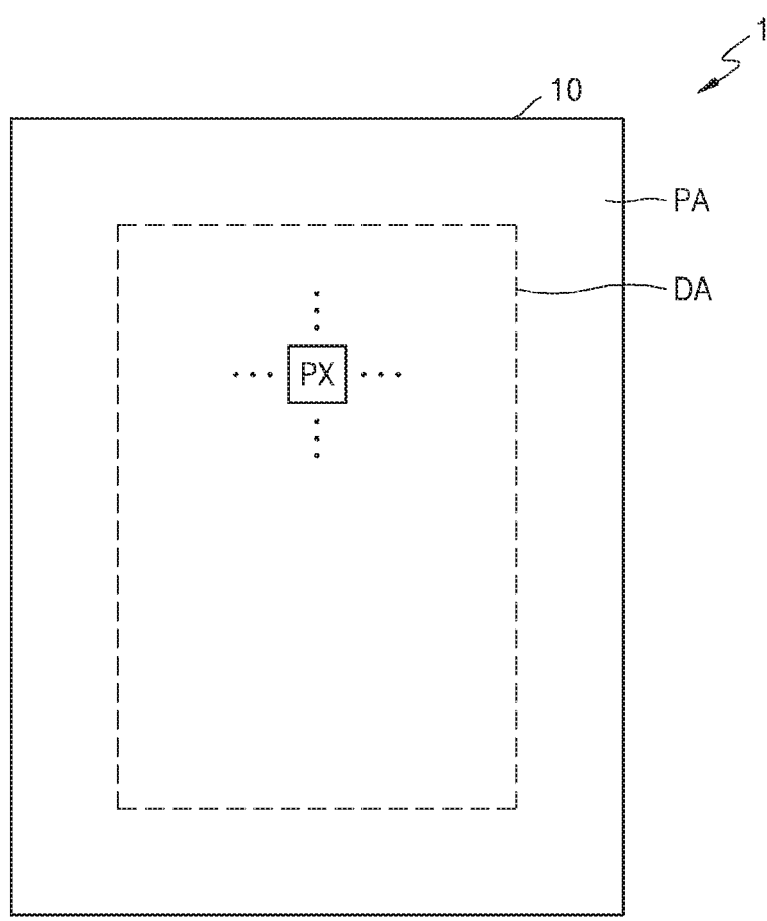
FIG. 1 is a schematic view of a display apparatus according to an exemplary embodiment of the present inventive concept.

Reference will now be made in detail to embodiments of the inventive concept, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

An expression used in the singular encompasses the expression of the plural, unless it has a clearly different meaning in the context.

When a certain embodiment may be implemented differently, a specific process order may be performed differently from the described order. For example, two consecutively described processes may be performed substantially at the same time or performed in an order opposite to the described order.

The exemplary embodiments will be described below in more detail with reference to the accompanying drawings.

Figure 2:
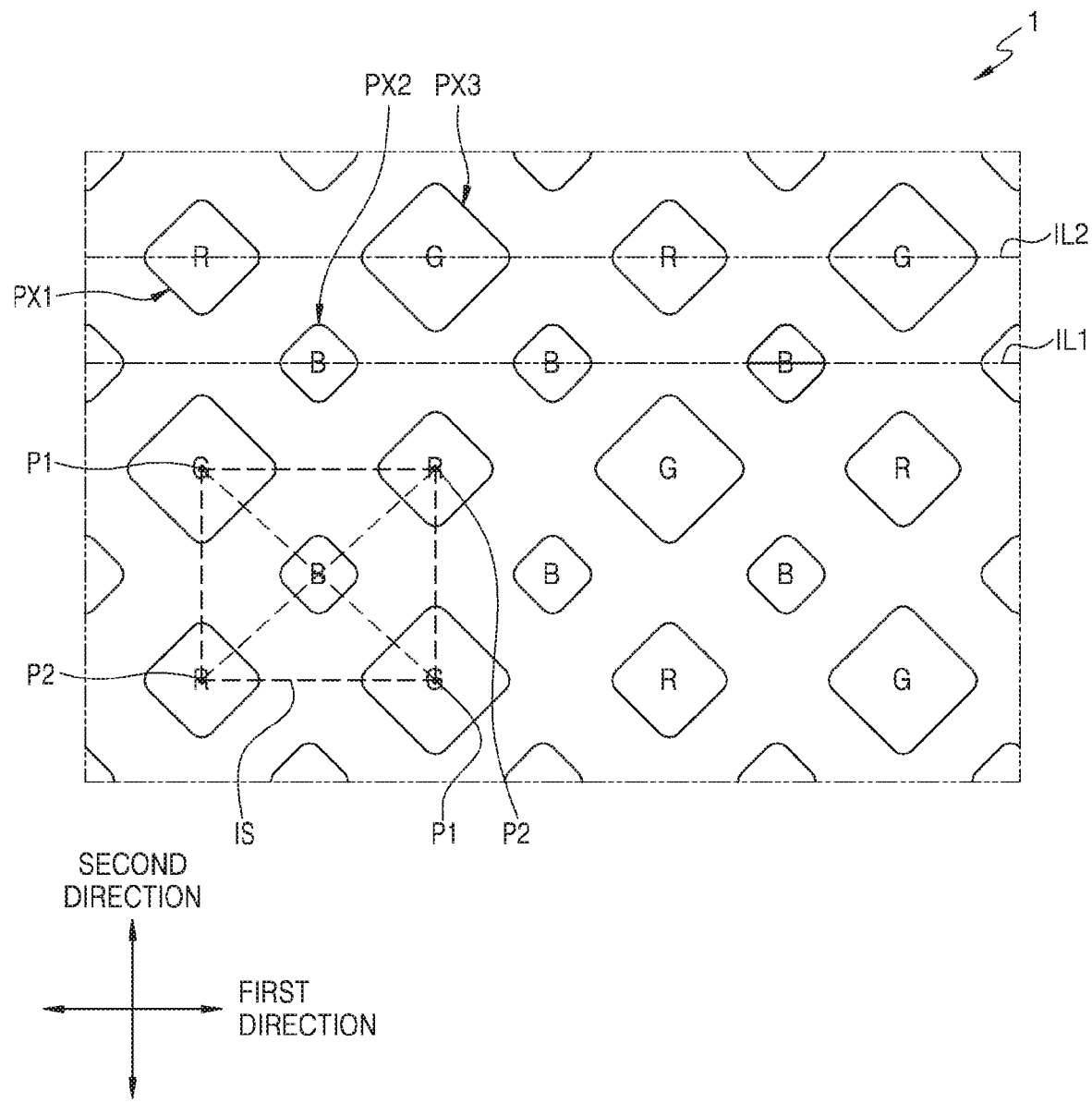
FIG. 2 is a partial plan view showing a pixel arrangement of a display apparatus according to an exemplary embodiment of the present inventive concept.

FIG. 1 is a schematic view of a display apparatus 1 according to an exemplary embodiment of the present inventive concept. FIG. 2 is a partial plan view showing a pixel arrangement of the display apparatus 1 according to an embodiment of the present inventive concept.

Referring to FIG. 1, the display apparatus 1 according to an embodiment of the present inventive concept includes a substrate 10. The substrate 10 includes a display area DA and a peripheral area PA located outside the display area DA.

A plurality of pixels PX may be arranged in the display area DA of the substrate 10. Various wirings via which an electric signal to be applied to the display area DA is transmitted may be located in the peripheral area PA of the substrate 10.

Referring to FIG. 2, a plurality of pixels are disposed in the display area DA. For example, the display apparatus 1 includes a plurality of first pixels PX1, a plurality of second pixels PX2, and a plurality of third pixels PX3. The first pixel PX1, the second pixel PX2, and the third pixel PX3 may be repeatedly arranged in a predetermined pattern in column and row directions.

In an embodiment, the second pixel PX2 has a smaller area than the first pixel PX1 and the third pixel PX3 that are adjacent thereto. In an embodiment, the second pixel PX2 is a blue pixel B emitting blue light. The second pixels PX2 are spaced apart from each other and arranged on an imaginary first straight line ILL The second pixel PX2 may have a polygonal shape such as a quadrangle or an octagon, a circle shape, or an oval shape, and the polygonal shape may also be a round polygon. In an embodiment, the second pixel PX2 has a diamond shape with rounded corners.

The third pixel PX3 is located in a pair of first vertexes P1 of an imaginary quadrangle IS in which the second pixel PX2 is centered at a center of the quadrangle, wherein the first vertexes P1 face each other. The first pixel PX1 is located in a pair of second vertexes P2 of the imaginary quadrangles IS, wherein the second vertexes P2 face each other. In an embodiment, the imaginary quadrangle IS is a square.

The first pixel PX1 is spaced apart from the second pixel PX2 and the third pixel PX3, and located at the second vertex P2 adjacent to the first vertex P1 of the imaginary quadrangle IS. In an embodiment, the first pixel PX1 has a larger area than the second pixels PX2 adjacent thereto. In an embodiment, the first pixel PX1 is a red pixel R emitting red light. The first pixel PX1 may have a shape such as a polygon including a quadrangle and an octagon, a circle, and an ellipse. The polygon may include a round polygon. In an embodiment, the first pixel PX1 has a diamond shape with rounded corners.

The third pixel PX3 is spaced apart from the first pixel PX1 and the second pixel PX2, and located at the first vertex P1 of the imaginary quadrangle IS. In an embodiment, the third pixel PX3 has a larger area than the second pixel PX2 adjacent thereto. In addition, in an embodiment, the third pixel PX3 has an area different from that of the first pixel PX1. In an embodiment, the third pixel PX3 has a larger area than the first pixel PX1. In another embodiment, the third pixel PX3 has a same area as the first pixel PX1. In an embodiment, the third pixel PX3 is a green pixel G emitting green light. The third pixel PX3 may have a shape such as a polygon including a quadrangle and an octagon, a circle, and an ellipse. The polygon may include a round polygon. In an embodiment, the third pixel PX3 has a diamond shape with rounded corners.

The plurality of first pixels PX1 and the plurality of third pixels PX3 are mutually alternately arranged on an imaginary second straight line IL2, and thus the plurality of third pixels PX3 in the first vertexes P1 and the plurality of first pixels PX1 in the second vertexes P2 surround the second pixels PX2.

The plurality of pixels are repeatedly arranged in each row in a first direction, in an order of the first pixel PX1, the second pixel PX2, the third pixel PX3, and the second pixel PX2.

The blue pixel B has a relatively low efficiency in an organic light-emitting device OLED. Accordingly, according to an embodiment of the present inventive concept, an efficiency of the display apparatus 1 is improved by arranging two blue pixels B with respect to one red pixel R and one green pixel G.

Figure 3:
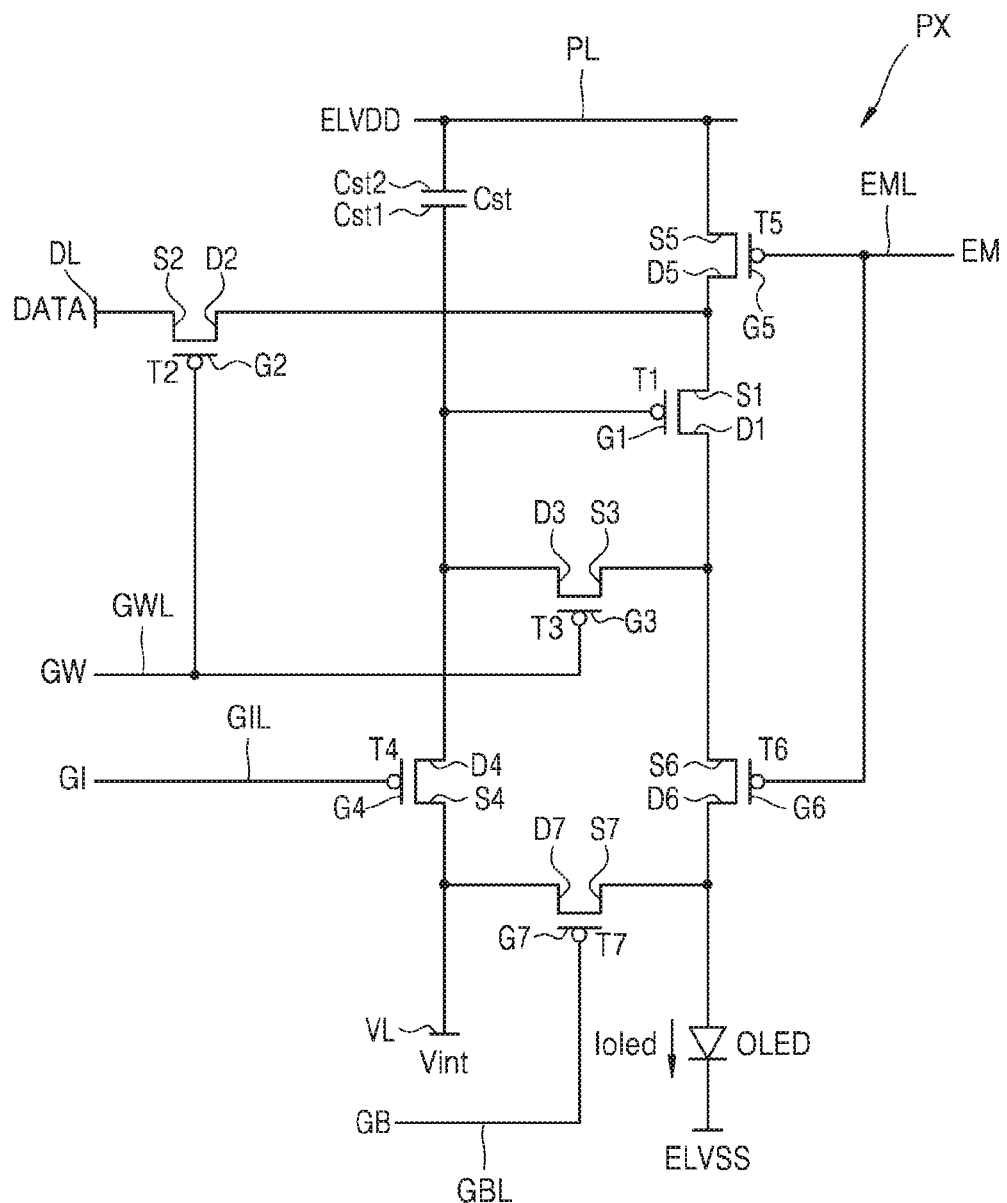
FIG. 3 is an equivalent circuit diagram of a pixel of the display apparatus of FIG. 1 according to an exemplary embodiment of the present inventive concept.

FIG. 3 is an equivalent circuit diagram of a pixel PX of the display apparatus 1 of FIG. 1 according to an exemplary embodiment of the present inventive concept.

The pixel PX includes a light-emitting device emitting light and a pixel circuit that receives a signal from a plurality of wirings to drive the light-emitting device. Hereinafter, a pixel PX having an organic light-emitting device OLED as a light-emitting device will be described as an example. The pixel PX illustrated in FIG. 3 may be equally applied to each of the first through third pixels PX1 through PX3.

The wirings may include a first scan line GIL for transmitting a first scan signal GI, a second scan line GWL for transmitting a second scan signal GW, a third scan line GBL for transmitting a third scan signal GB, a data line DL for transmitting a data signal DATA, and a power line PL for transmitting a first power source voltage ELVDD. Embodiments of the pixel circuit are not limited thereto, and may further include an initialization line VL for transmitting an initialization voltage Vint and an emission control line EML for transmitting an emission control signal EM as illustrated in FIG. 3.

In an embodiment, the pixel circuit of the pixel PX includes a plurality of transistors, for example, first through seventh transistors T1 through T7 and a capacitor Cst.

The first transistor T1 includes a gate electrode G1 connected to a first electrode Cst1 of the capacitor Cst, a first electrode S1 connected to the power line PL via the fifth transistor T5, and a second electrode D1 electrically connected to a pixel electrode of the organic light-emitting device OLED via the sixth transistor T6. The first transistor T1 functions as a driving transistor, and receives a data signal DATA according to a switching operation of the second transistor T2 to supply a current to the organic light-emitting device OLED.

The second transistor T2 includes a gate electrode G2 connected to the second scan line GWL, a first electrode S2 connected to the data line DL, and a second electrode D2 connected to the first electrode S1 of the first transistor T1. The second transistor T2 is turned on according to a second scan signal GW transmitted through the second scan line GWL and transfers the data signal DATA transferred to the data line DL, to the first electrode S1 of the first transistor T1.

The third transistor T3 includes a gate electrode G3 connected to the second scan line GWL, a first electrode S3 connected to the second electrode D1 of the first transistor T1, and a second electrode D3 connected to the first electrode Cst1 of the capacitor Cst, a second electrode D4 of the fourth transistor T4, and the gate electrode G1 of the first transistor T1. The third transistor T3 is turned on according to a second scan signal GW transmitted through the second scan line GWL to diode-connect the first transistor T1.

The fourth transistor T4 includes a gate electrode G4 connected to the first scan line GIL, a first electrode S4 connected to the initialization line VL, and the second electrode D4 connected to the first electrode Cst1 of the capacitor Cst, the second electrode D3 of the third transistor T3, and the gate electrode G1 of the first transistor T1. The fourth transistor T4 is turned on according to a first scan signal GI transferred through the first scan line GIL to perform an initialization operation of initializing a gate voltage of the first transistor T1 by transferring an initialization voltage Vint to the gate electrode G1 of the first transistor T1.

The fifth transistor T5 includes a gate electrode G5 connected to the emission control line EML, a first electrode S5 connected to the power line PL, and a second electrode D5 connected to the first electrode S1 of the first transistor T1 and the second electrode D2 of the second transistor T2.

The sixth transistor T6 includes a gate electrode G6 connected to the emission control line EML, a first electrode S6 connected to the second electrode D1 of the first transistor T1 and the first electrode S3 of the third transistor T3, and a second electrode D6 connected to the pixel electrode of the organic light-emitting device OLED.

The fifth transistor T5 and the sixth transistor T6 are simultaneously turned on in response to an emission control signal EM received through the emission control line EML so that a current flows through the organic light-emitting device OLED.

The seventh transistor T7 includes a gate electrode G7 connected to the third scan line GBL, a first electrode S7 connected to the second electrode D6 of the sixth transistor T6 and the pixel electrode of the organic light-emitting device OLED, and a second electrode D7 connected to the initialization line VL. The seventh transistor T7 is turned on according to a third scan signal GB transferred through the third scan line GBL to perform an initialization operation of initializing a voltage of the pixel electrode of the organic light-emitting device OLED by transferring an initialization voltage Vint to the pixel electrode of the organic light-emitting device OLED.

The third scan line GBL connected to the gate electrode G7 of the seventh transistor T7 may be the first scan line GIL or the second scan line GWL of a next row or a previous row, and the third scan signal GB may be the first scan signal GI or the second scan signal GW of a next row or a previous row. In one embodiment, the seventh transistor T7 is omitted.

The capacitor Cst includes the first electrode Cst1 connected to the gate electrode G1 of the first transistor T1 and a second electrode Cst2 connected to the power line PL. The first electrode Cst1 of the capacitor Cst is also connected to the second electrode D3 of the third transistor T3 and the second electrode D4 of the fourth transistor T4. In an embodiment, the first electrode Cst1 and the second electrode Cst2 are each made of a conductive material.

The organic light-emitting device OLED includes the pixel electrode and a common electrode facing the pixel electrode. In an embodiment, the common electrode receives a second power source voltage ELVSS. In an embodiment, the first power source voltage ELVDD is higher than the second power source voltage ELVSS. In an embodiment, the second power source voltage ELVSS is a ground voltage.

In an embodiment, an intermediate layer is included between the pixel electrode and the common electrode of the organic light-emitting device OLED. The intermediate layer includes an organic light-emitting layer emitting light, and may further include at least one of various functional layers such as a hole injection layer (HIL), a hole transport layer (HTL), an electron transport layer (ETL), and an electron injection layer (EIL). However, embodiments of the inventive concept are not limited thereto, as various functional layers may be further disposed between the pixel electrode and an organic light-emitting layer and/or between an organic light-emitting layer and the common electrode.

The organic light-emitting layer may emit red light, green light or blue light. However, embodiments of the present inventive concept are not limited thereto, as the organic light-emitting layer may also emit white light. In this case, the organic light-emitting layer may include a structure in which an emission material emitting red light, an emission material emitting green light, and an emission material emitting blue light are stacked, or a structure in which an emission material emitting red light, an emission material emitting green light, and an emission material emitting blue light are mixed.

In an embodiment, the organic light-emitting device OLED is capable of displaying an image by receiving a driving current Ioled from the first transistor T1 to emit light of a predetermined color, thereby displaying an image.

Figure 4:
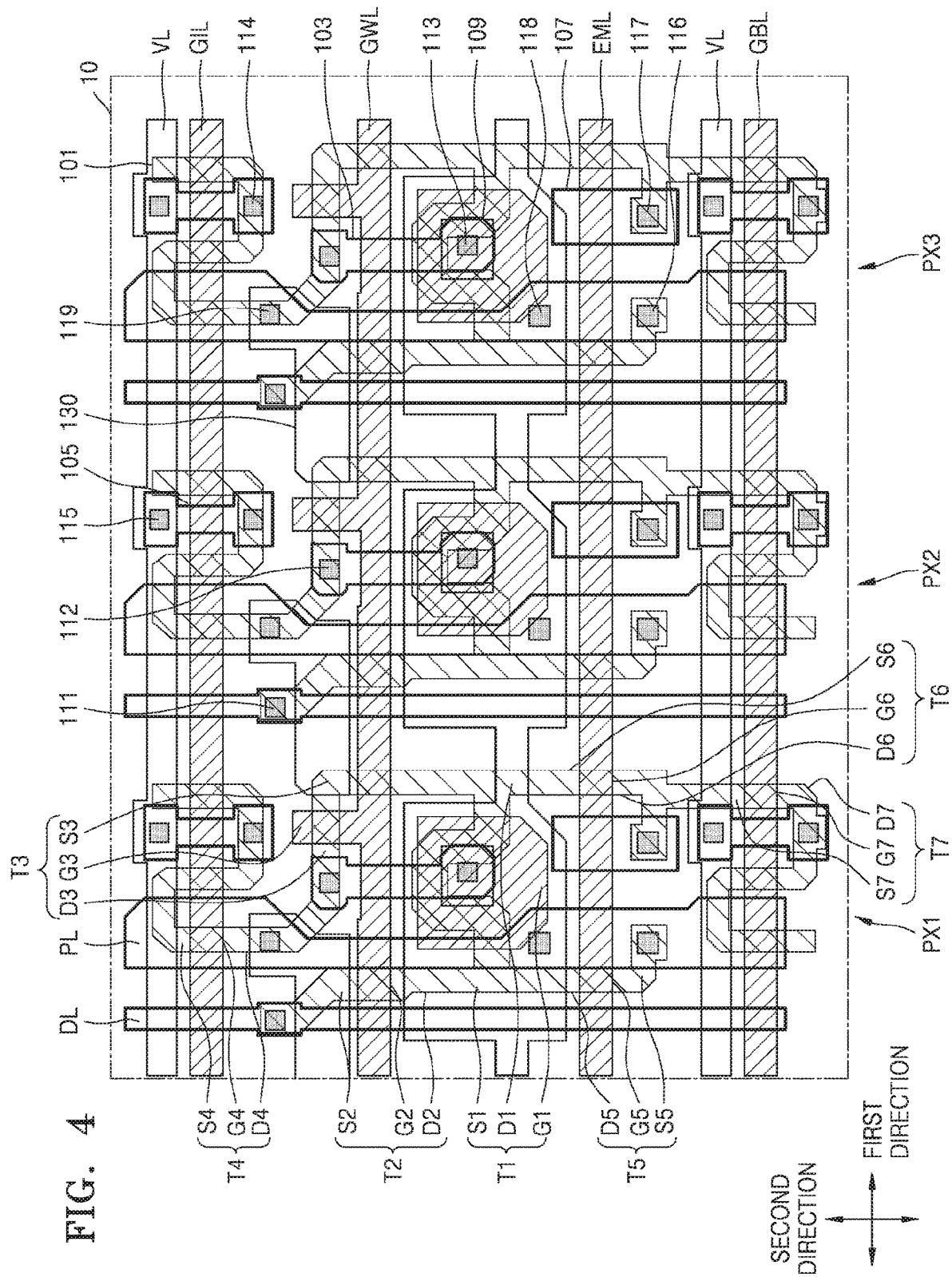
FIGS. 4 and 5 are plan views illustrating the pixel of FIG. 3 according to an exemplary embodiment of the present inventive concept.
Figure 5:
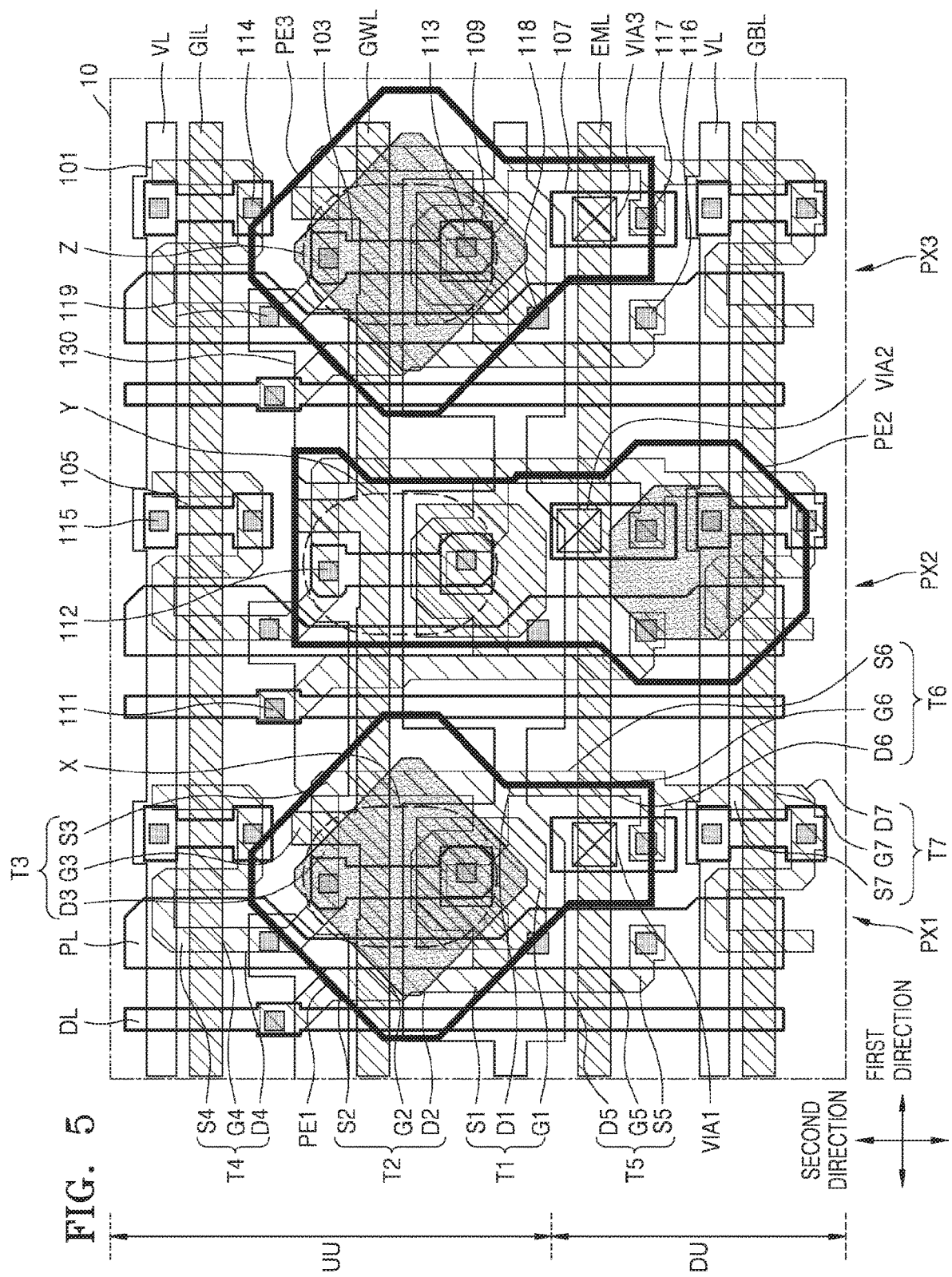
Figure 6:
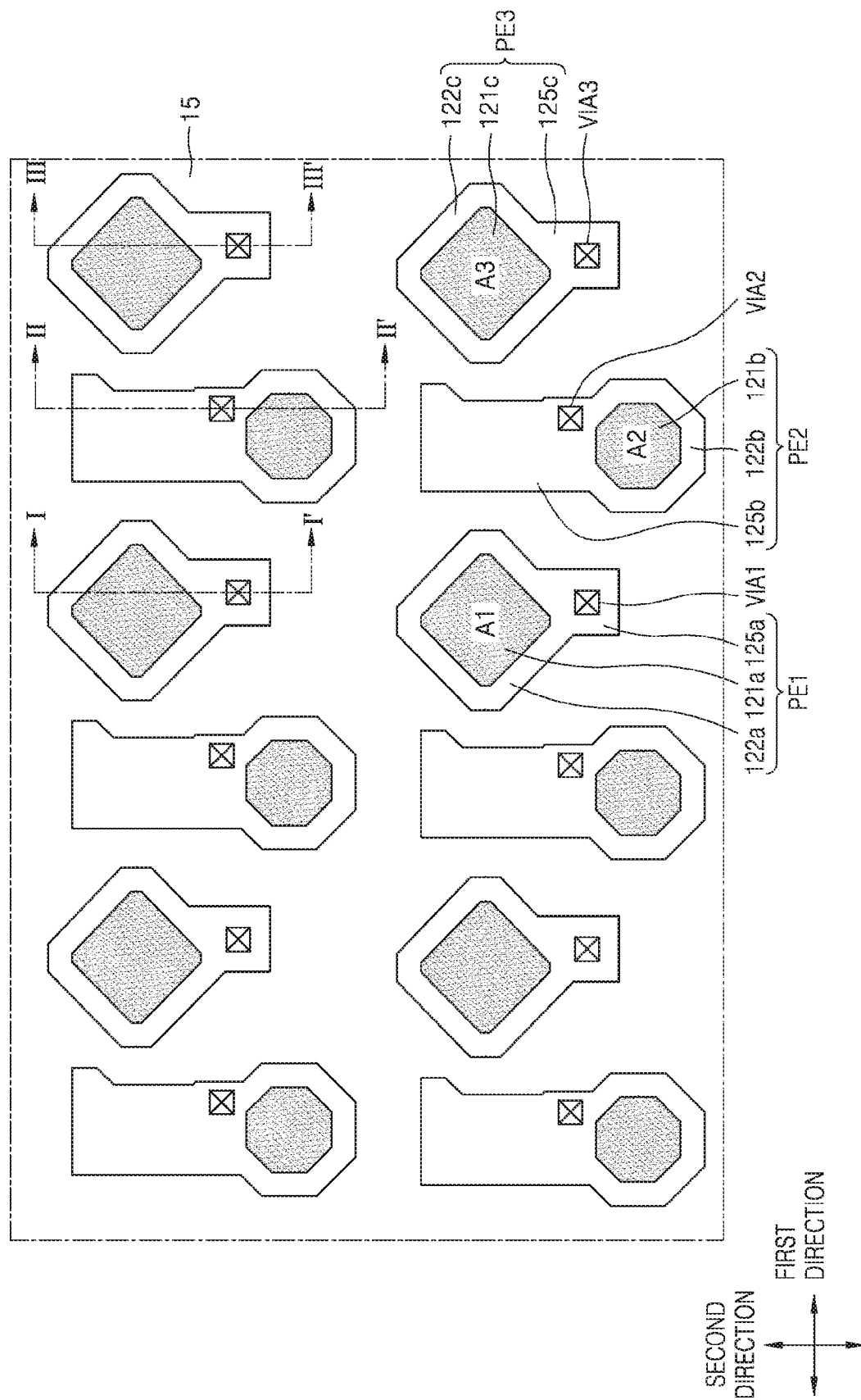
FIG. 6 is a view showing an arrangement of pixel electrodes according to an exemplary embodiment of the present inventive concept.
Figure 7:
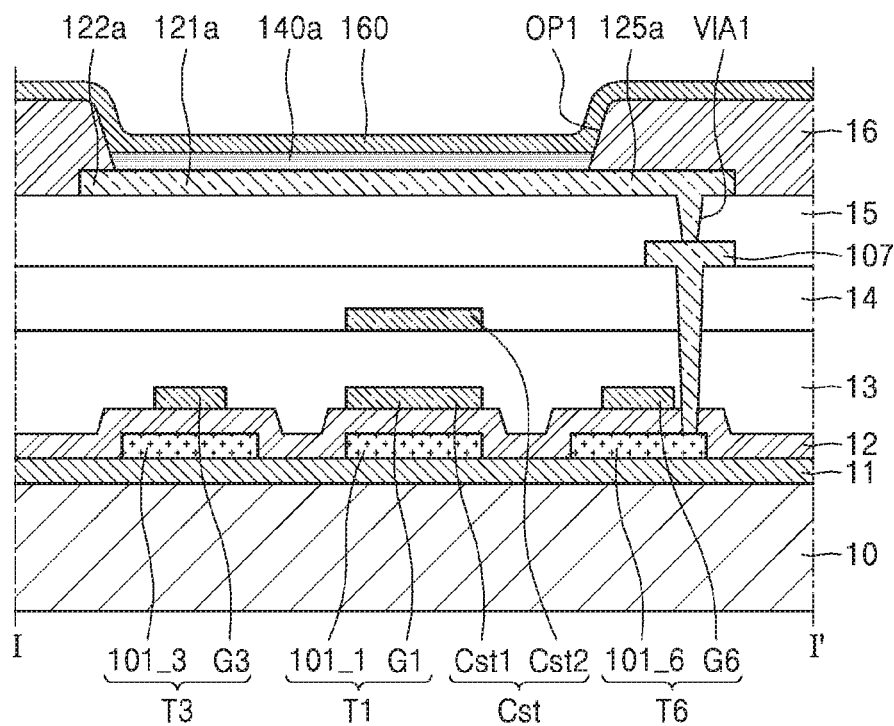
FIG. 7 is a cross-sectional view taken along line I-I' of FIG. 6.
Figure 8:
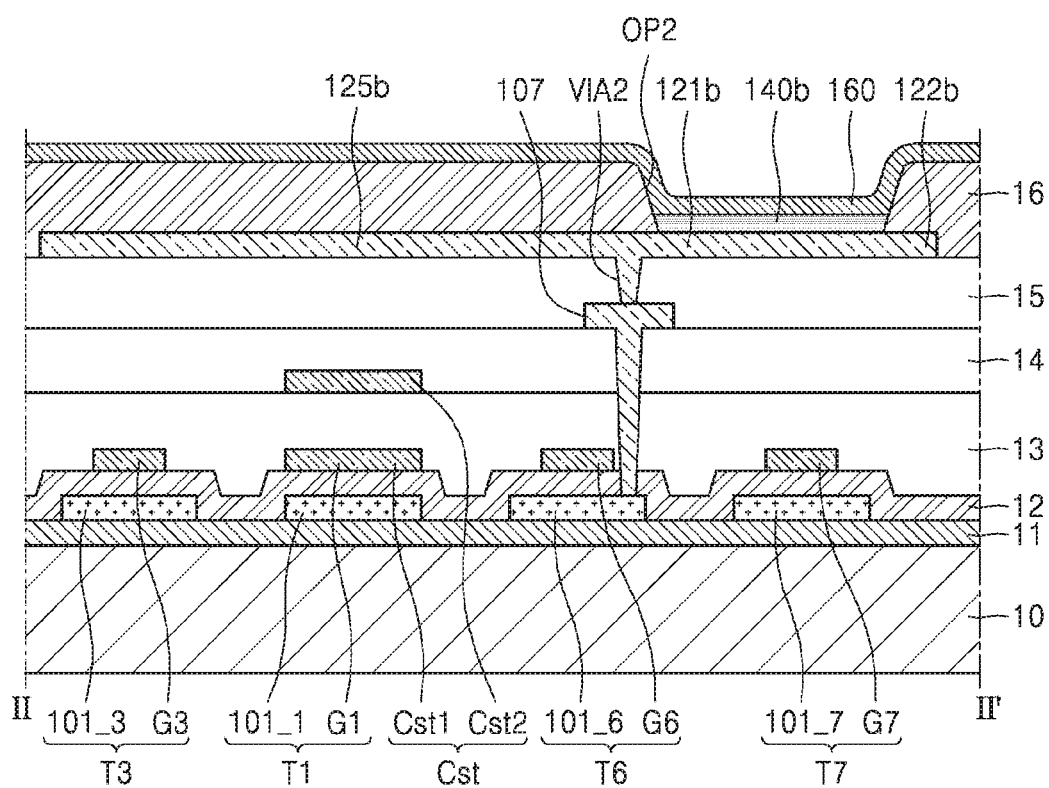
FIG. 8 is a cross-sectional view taken along line II-II' of FIG. 6.
Figure 9:
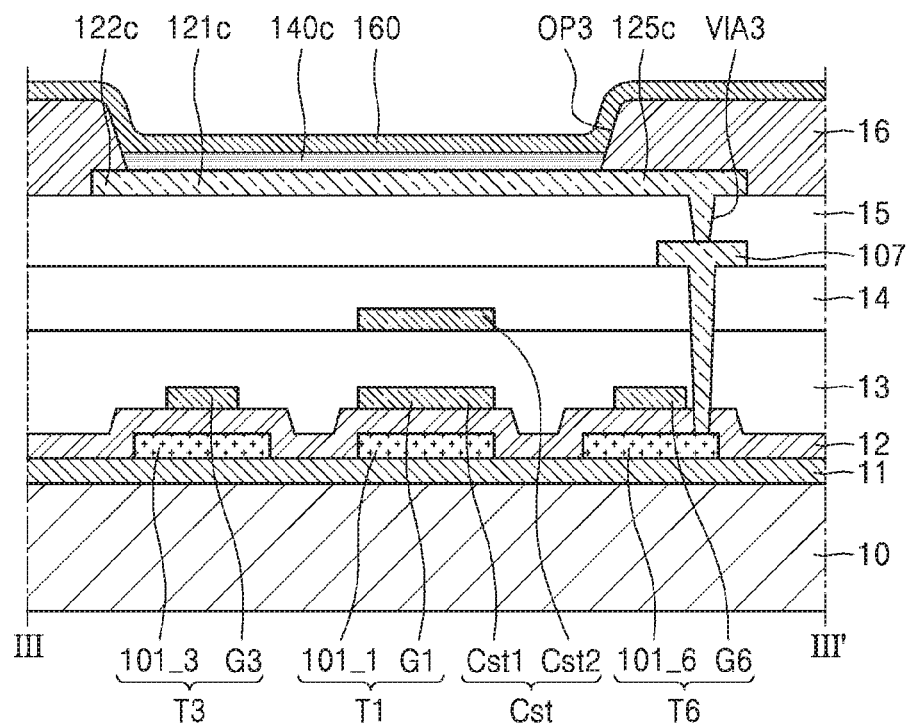
FIG. 9 is a cross-sectional view taken along line III-III' of FIG. 6.

FIGS. 4 and 5 are plan views illustrating the pixel PX of FIG. 3 according to an exemplary embodiment of the present inventive concept. FIG. 6 is a view showing an arrangement of pixel electrodes according to an exemplary embodiment of the present inventive concept. FIG. 7 is a cross-sectional view taken along line I-I' of FIG. 6; FIG. 8 is a cross-sectional view taken along line II-II' of FIG. 6; and FIG. 9 is a cross-sectional view taken along line III-III' of FIG. 6.

FIG. 4 is a plan view showing the pixel circuit of FIG. 3. Referring to FIG. 4 and FIGS. 7 through 9 together, in the pixel arrangement according to the embodiment of the present inventive concept, a first pixel region of a first column, a second pixel region of a second column, a third pixel region of a third column, and a fourth pixel region of a fourth column are repeated in a first direction of the substrate 10, and the first pixel PX1, the second pixel PX2, the third pixel PX3, and the second pixel PX2 are repeatedly arranged in the first through fourth pixel regions. In an embodiment, the first pixel region is a red pixel region in which a red pixel R is disposed, and the second pixel region and the fourth pixel region are a blue pixel region in which a blue pixel B is disposed, and the third pixel region is a green pixel region in which a green pixel G is disposed.

FIG. 4 illustrates an example in which the first pixel PX1 is disposed in the first pixel region of the substrate 10, the second pixel PX2 is disposed in the second pixel region adjacent to the first pixel region, and the third pixel PX3 is disposed in the third pixel region adjacent to the second pixel region. Although not shown, in an exemplary embodiment, the second pixel PX2 is disposed in a fourth pixel region adjacent to the third pixel region.

The first pixel PX1 includes a first light-emitting device and a first pixel circuit connected to the first light-emitting device. The second pixel PX2 includes a second light-emitting device and a second pixel circuit connected to the second light-emitting device. The third pixel PX3 includes a third light-emitting device and a third pixel circuit connected to the third light-emitting device.

The first through third pixels PX1 through PX3 are disposed at points where a plurality of wirings extending in the first direction and a plurality of wirings extending in a second direction crossing the first direction intersect with each other. The first scan line GIL, the second scan line GWL, the third scan line GBL, the initialization line VL, and the emission control line EML extend in the first direction. The data line DL and the power line PL extend in the second direction.

The first through seventh transistors T1 through T7 of each of the first through third pixel circuits may be implemented each as a thin film transistor including a semiconductor layer including a source region, a drain region, and a channel region between the source region and the drain region and a gate electrode insulated from the semiconductor layer and located at a position corresponding to the channel region. The first through third pixel circuits are identical, and thus will each be described as the pixel PX or the pixel circuit.

A buffer layer 11 is disposed on the substrate 10, and a semiconductor layer 101 of the first through seventh transistors T1 through T7 is disposed on the buffer layer 11. In one embodiment, the buffer layer 11 is omitted.

The semiconductor layer 101 may be formed of, for example, polysilicon. The first through seventh transistors T1 through T7 may be formed along the semiconductor layer 101. In an embodiment, semiconductor layers of the first through seventh transistors T1 through T7 are each disposed at a same level. The semiconductor layers 101 may be connected to each other and may be bent in various forms. In an embodiment, the semiconductor layers 101 of the first through seventh transistors T1 through T7 each include a channel region that is not doped with an impurity and a source region and a drain region which are doped with an impurity. Here, the impurity varies according to a type of a transistor and may be an N-type impurity or a P-type impurity. Hereinafter, the semiconductor layers of the first through seventh transistors T1 through T7 will be referred to as semiconductor layers 101_1 through 101_7, and illustration thereof is omitted in FIGS. 4 and 5. The first and second electrodes of the transistors illustrated in FIG. 3 respectively correspond to the source and drain regions illustrated in FIG. 4. Hereinafter, the terms 'a first electrode' and 'a second electrode' of a transistor may respectively refer to 'a source region' and 'a drain region' or vice versa.

A first insulating layer 12 is disposed on the semiconductor layer 101, and the gate electrodes G1 through G7 of the first through seventh transistors T1 through T7 are disposed on the first insulating layer 12. In an embodiment, the first scan line GIL, the second scan line GWL, the third scan line GBL, and the emission control line EML extending in the first direction are disposed at a same level as the gate electrodes G1 through G7 of the first through seventh transistors T1 through T7.

The first transistor T1 includes a semiconductor layer 101_1 and a gate electrode G1, wherein the semiconductor layer 101_1 includes a source region S1 and a drain region D1 and a channel region between the source region S1 and the drain region D1. The gate electrode G1 of the first transistor T1 planarly overlaps with the channel region. In one embodiment, the semiconductor layer 101_1 of the first transistor T1 has a curvature between the source region S1 and the drain region D1 so that the channel region is elongated, thereby broadening a driving range of a gate voltage applied to the gate electrode G1. The semiconductor layer 101_1 of the first transistor T1 may have various shapes such as '⊏', '2', 'S', 'M', and 'W'.

The second transistor T2 includes a semiconductor layer and a gate electrode G2, wherein the semiconductor layer includes a source region S2 and a drain region D2 and a channel region between the source region S2 and the drain region D2. In an embodiment, the gate electrode G2 of the second transistor T2 planarly overlaps with the channel region. The source region S2 of the second transistor T2 is electrically connected to a data line DL through a contact hole 111 of first through third insulating layers 12 through 14. The drain region D2 of the second transistor T2 is connected to the source region S1 of the first transistor T1.

The third transistor T3 includes a semiconductor layer 101_3 and a gate electrode G3, wherein the semiconductor layer 101_3 includes a source region S3 and a drain region D3 and a channel region between the source region S3 and the drain region D3. In an embodiment, the gate electrode G3 of the third transistor T3 planarly overlaps with the channel region and is formed of a portion of the second scan line GWL. The source region S3 of the third transistor T3 is connected to the drain region D1 of the first transistor T1, and the drain region D3 is electrically connected to the gate electrode G1 of the first transistor T1 via a connection electrode 103. The connection electrode 103 electrically connects the drain region D3 of the third transistor T3 to the gate electrode G1 of the first transistor T1 via a contact hole 112 of the first through third insulating layers 12, 13, and 14 exposing the drain region D3 of the third transistor T3 and a contact hole 113 of the second insulating layer 13 and the third insulating layer 14 exposing the gate electrode G1 of the first transistor T1.

The fourth transistor T4 includes a semiconductor layer and a gate electrode G4, wherein the semiconductor layer includes a source region S4 and a drain region D4 and a channel region between the source region S4 and the drain region D4. In an embodiment, the gate electrode G4 of the fourth transistor T4 planarly overlaps with the channel region, and is formed of a portion of the first scan line GIL. The source region S4 of the fourth transistor T4 is electrically connected to the initialization line VL via a connection electrode 105, and the drain region D4 is electrically connected to the drain region D3 of the third transistor T3 and the gate electrode G1 of the first transistor T1. The connection electrode 105 connects the source region S4 of the fourth transistor T4 to the initialization line VL through a contact hole 114 of the first through third insulating layers 12, 13, and 14 exposing the source region S4 of the fourth transistor T4 and a contact hole 115 of the third insulating layer 14 exposing the initialization line VL. In an embodiment, the initialization line VL is disposed at a same level as the second electrode Cst2 of the capacitor Cst.

The fifth transistor T5 includes a semiconductor layer and a gate electrode G5, wherein the semiconductor layer includes a source region S5 and a drain region D5 and a channel region between the source region S5 and the drain region D5. In an embodiment, the gate electrode G5 of the fifth transistor T5 planarly overlaps with the channel region, and is formed of a portion of the emission control line EML. The source region S5 of the fifth transistor T5 is electrically connected to the power line PL through a contact hole 116 of the first through third insulating layers 12, 13, and 14 exposing a portion of the source region S5, and the drain region D5 is connected to the first electrode S1 of the first transistor T1.

The sixth transistor T6 includes a semiconductor layer 101_6 and a gate electrode G6, wherein the semiconductor layer 101_6 includes a source region S6, a drain region D6 and a channel region between the source region S6 and the drain region D6. In an embodiment, the gate electrode G6 of the sixth transistor T6 planarly overlaps with the channel region, and is formed of a portion of the emission control line EML. The source region S6 of the sixth transistor T6 is connected to the drain region D1 of the first transistor T1, and the drain region D6 is electrically connected to the pixel electrode of the organic light-emitting device OLED. The drain region D6 of the sixth transistor T6 is electrically connected to a connection electrode 107 on the third insulating layer 14 through a contact hole 117 of the first through third insulating layers 12, 13, and 14 exposing a portion of the drain region D6. The pixel electrode is connected to the drain region D6 of the sixth transistor T6 by being electrically connected to the connection electrode 107 through a via hole of a fourth insulating layer 15 on the connection electrode 107 connected to the drain region D6 of the sixth transistor T6.

The seventh transistor T7 includes a semiconductor layer 101_7 and a gate electrode G7, wherein the semiconductor layer 101_7 includes a source region S7, a drain region D7, and a channel region between the source region S7 and the drain region D7. In an embodiment, the gate electrode G7 of the seventh transistor T7 planarly overlaps with the channel region and is formed of a portion of the third scan line GBL. The drain region D7 of the seventh transistor T7 is connected to the source region S4 of the fourth transistor T4, and the source region S7 is connected to the drain region D6 of the sixth transistor T6.

The second insulating layer 13 is disposed on the gate electrodes G1 through G7 of the first through seventh transistors T1 through T7. The second electrode Cst2 of the capacitor Cst is disposed on the second insulating layer 13. In an embodiment, the initialization line VL and a shielding member 130 are disposed at a same level as the second electrode Cst2 of the capacitor Cst. In an embodiment, the shielding member 130 is a light-shielding member such as a black matrix. The light-shielding member may include a light absorbing material.

The first electrode Cst1 of the capacitor Cst is the gate electrode G1 of the first transistor T1. That is, the first electrode Cst1 of the capacitor Cst and the gate electrode G1 of the first transistor T1 may be understood to be a single unit. In an embodiment, the first electrode Cst1 of the capacitor Cst is separated from adjacent pixels and formed in a rectangular shape, and is formed of a same material and at a same level as the first scan line GIL, the second scan line GWL, the third scan line GBL, and the emission control line EML.

In an embodiment, the second electrode Cst2 of the capacitor Cst is connected to the second electrode Cst2 of adjacent pixels in the first direction, that is, pixels in a same row. The second electrode Cst2 of the capacitor Cst overlaps with the first electrode Cst1 to cover the entire first electrode Cst1, and has a structure vertically overlapping with the first transistor T1 planarly and along a cross-section. The second insulating layer 13 between the first electrode Cst1 and the second electrode Cst2 of the capacitor Cst functions as a dielectric layer. The second electrode Cst2 of the capacitor Cst has an opening 109 at a position corresponding to the contact hole 113 exposing a portion of the first electrode Cst1.

A third insulating layer 14 is disposed on the second electrode Cst2 of the capacitor Cst. The data line DL and the power line PL extend on the third insulating layer 14 in the second direction. In an embodiment, the power line PL partially overlaps with the second electrode Cst2 of the capacitor Cst.

The second electrode Cst2 of the capacitor Cst is electrically connected to the power line PL through a contact hole 118 of the third insulating layer 14 exposing a portion of the second electrode Cst2. Accordingly, the power line PL functions as a power line extending in the second direction, and the second electrode Cst2 of the capacitor Cst functions as a power line extending in the first direction, so that the power line PL may overall have a mesh structure. The power line PL is electrically connected to the source region S5 of the fifth transistor T5.

The shielding member 130 is electrically connected to the power line PL through a contact hole 119 of the third insulating layer 14 exposing a portion of the shielding member 130. The shielding member 130 at least partially overlaps with the second transistor T2 in the first direction. The shielding member 130 may overlap with at least one of the source region S2 and the drain region D2 of the second transistor T2. The shielding member 130 may prevent the second transistor T2 from being affected by light incident from the outside. The shielding member 130 may be electrically connected to the power line PL through which a constant voltage is applied, so as to prevent the second transistor T2 from being affected by other electrical signals in the vicinity. That is, the shielding member 130 may improve operational characteristics of the pixel circuit.

Although the shielding member 130 is connected to the power line PL according to the above-described embodiment, embodiments of the present inventive concept are not limited thereto. In one embodiment, the shielding member 130 is connected to the initialization line VL, and an initial voltage Vint, which is a constant voltage, is applied to the shielding member 130. Alternatively, a constant voltage ELVSS may be applied to the shielding member 130.

In an embodiment, the connection electrodes 103, 105, and 107 are arranged at a same level as the data line DL and the power line PL. The connection electrodes 103, 105, and 107 fill the contact holes 112 through 115 and 117 formed in at least one of the first through third insulating layers 12 through 14 to contact the electrode layers therebelow.

FIG. 5 is a plan view illustrating an example in which a portion of an organic light-emitting device is formed on the pixel circuit of FIG. 4. Referring to FIGS. 5 to 9 together, the fourth insulating layer 15 is disposed on the first pixel circuit through the third pixel circuit.

First through third pixel electrodes PE1 through PE3 respectively electrically connected to the first through third pixel circuits are disposed on the fourth insulating layer 15. The first pixel electrode PE1 connected to the first pixel circuit is disposed on the first pixel circuit of the first pixel PX1. The second pixel electrode PE2 connected to the second pixel circuit is disposed on the second pixel circuit of the second pixel PX2. The third pixel electrode PE3 connected to the third pixel circuit is disposed on the third pixel circuit of the third pixel PX3.

In an embodiment, the first pixel electrode PE1 and the second pixel electrode PE2 are disposed adjacent to each other planarly in a diagonal direction. In an embodiment, the first pixel electrode PE1 extends in the second direction to a first point along a first imaginary line arranged in the first direction, the second pixel electrode PE2 extends in the second direction to a second point along a second imaginary line, where the second imaginary line extends in the first direction, and the first imaginary line is higher than the second imaginary line. In the embodiment, the first pixel electrode PE1 extends in a direction opposite to the second direction to a third point along a third imaginary line, the second pixel electrode PE2 extends in a direction opposite to the second direction to a fourth point along a fourth imaginary line lower than the third imaginary line, and the third and fourth imaginary lines extend in the first direction. In an embodiment, the third pixel electrode PE3 and the second pixel electrode PE2 are disposed adjacent to each other planarly in a diagonal direction. In an embodiment, the third pixel electrode PE3 extends in the second direction to a fifth point along a fifth imaginary line arranged in the first direction and the fifth imaginary line is higher than the second imaginary line. In the embodiment, the third pixel electrode PE3 extends in a direction opposite to the second direction to a sixth point along a sixth imaginary line higher than the fourth imaginary line. The fifth and sixth imaginary lines extend in the first direction.

The first pixel electrode PE1 (e.g., see 122a, 121a, and 125a of FIG. 7) contacts the connection electrode 107 through a first via hole VIA1 of the fourth insulating layer 15. Accordingly, the first pixel electrode PE1 is electrically connected to the drain region D6 of the sixth transistor T6 of the first pixel PX1 through the first via hole VIAL The second pixel electrode PE2 (e.g., see 125b, 121b, and 122b of FIG. 8) contacts the connection electrode 107 through a second via hole VIA2 of the fourth insulating layer 15. Accordingly, the second pixel electrode PE2 is electrically connected to the drain region D6 of the sixth transistor T6 of the second pixel PX2 through the second via hole VIA2.

The third pixel electrode PE3 (e.g., see 122c, 121c, and 125c of FIG. 9) contacts the connection electrode 107 through a third via hole VIA3 of the fourth insulating layer 15. Accordingly, the third pixel electrode PE3 is electrically connected to the drain region D6 of the sixth transistor T6 of the third pixel PX3 through the third via hole VIA3.

Referring to FIG. 6, the first pixel electrode PE1, the second pixel electrode PE2, the third pixel electrode PE3, and the second pixel electrode PE2 are repeatedly disposed in the first direction in each row on the fourth insulating layer 15. The first pixel electrodes PE1 are arranged in a first column in the second direction. The second pixel electrodes PE2 are arranged in a second column adjacent to the first column, in the second direction. The third pixel electrodes PE3 are arranged in a third column adjacent to the second column, in the second direction. The second pixel electrodes PE2 are arranged in a fourth column adjacent to the third column, in the second direction.

The first pixel electrode PE1 includes a first region 122a including a first light-emitting portion 121a in which a first light-emitting layer is disposed and a second region 125a extending from the first region 122a. In an embodiment, the second region 125a corresponds to a position of the first via hole VIA1 and is located on the first via hole VIAL The first light-emitting portion 121a has a first area A1.

The first light-emitting portion 121a of the first region 122a corresponds to a first opening OP1 of the fifth insulating layer 16, and an edge of the first region 122a is covered by the fifth insulating layer 16. For example, the first light-emitting portion 121a is disposed within the first opening OP1. The second region 125a may be disposed on the first via hole VIA1 to cover the first via hole VIAL In an embodiment, the second region 125a is covered by the fifth insulating layer 16. In an embodiment, the first via hole VIA1 is formed in the fourth insulating layer 15, and the first pixel electrode PE1 is electrically connected to the first pixel circuit via the first via hole VIAL For example, the second region 125a of the first pixel electrode PE1 connects to a connection electrode 107 through the first via hole VIAL In an embodiment, the first region 122a of the first pixel electrode PE1 is located planarly at an upper part of the first pixel circuit (UU in FIG. 5) relative to the second region 125a.

The second pixel electrode PE2 includes a first region 122b including a second light-emitting portion 121b in which a second light-emitting layer is disposed and a second region 125b extending from the first region 122b. In an embodiment, the second region 125b corresponds to a position of the second via hole VIA2, and is located on the second via hole VIA2. For example, the second region 125b of the second pixel electrode PE2 connects to the connection electrode 107 through the second via hole VIA2. The second light-emitting portion 121b has a second area A2. In an embodiment, the second area A2 is smaller than the first area A1.

In an embodiment, the second light-emitting portion 121b of the first region 122b corresponds to a second opening OP2 of the fifth insulating layer 16, and an edge of the first region 122b is covered by the fifth insulating layer 16. For example, the second light-emitting portion 121b is disposed within the second opening OP2. In an embodiment, the second region 125b is disposed on the second via hole VIA2 to cover the second via hole VIA2. In an embodiment, the second region 125b is covered by the fifth insulating layer 16. In an embodiment, the second via hole VIA2 is formed in the fourth insulating layer 15, and the second pixel electrode PE2 is electrically connected to the second pixel circuit via the second via hole VIA2. In an embodiment, the first region 122b of the second pixel electrode PE2 is located planarly at a lower part of the second pixel circuit (DU in FIG. 5) relative to the second region 125b.

The third pixel electrode PE3 includes a first region 122c including a third light-emitting portion 121c in which a third light-emitting layer is disposed and a second region 125c extending from the first region 122c. In an embodiment, the second region 125c corresponds to a position of the third via hole VIA3, and is located on the third via hole VIA3. The third light-emitting portion 121c has a third area A3. In an embodiment, the third area A3 is larger than the second area A2.

In an embodiment, the third light-emitting portion 121c of the first region 122c corresponds to a third opening OP3 of the fifth insulating layer 16, and an edge of the first region 122c is covered by the fifth insulating layer 16. For example, the third light-emitting portion 121c is disposed within the third opening OP3. In an embodiment, the second region 125c is disposed on the third via hole VIA3 to cover the third via hole VIA3. In an embodiment, the second region 125c is covered by the fifth insulating layer 16. In an embodiment, the third via hole VIA3 is formed in the fourth insulating layer 15, and the third pixel electrode PE3 is electrically connected to the third pixel circuit through the third via hole VIA3. In an embodiment, the first region 122c of the third pixel electrode PE3 is located planarly at the upper end of the third pixel circuit (UU in FIG. 5) relative to the second region 125c.

The first region 122a of the first pixel electrode PE1 is diagonally spaced apart from the first region 122b of the second pixel electrode PE2. The second region 125a of the first pixel electrode PE1 is diagonally spaced apart from the second region 125b of the second pixel electrode PE2.

The first region 122c of the third pixel electrode PE3 is diagonally spaced apart from the first region 122b of the second pixel electrode PE2. The second region 125c of the third pixel electrode PE3 is diagonally spaced apart from the second region 125b of the second pixel electrode PE2.

In an embodiment, a size (area) of the second region 125b of the second pixel electrode PE2 is greater than a size (area) of the second region 125a of the first pixel electrode PE1 and the second region 125c of the third pixel electrode PE3. In an embodiment, the size (area) of the second region 125a of the first pixel electrode PE1 and that of the second region 125c of the third pixel electrode PE3 is identical.

The second region 125b of the second pixel electrode PE2 is located between the first region 122a of the first pixel electrode PE1 and the first region 122c of the third pixel electrode PE3 in the plan view.

FIG. 7 is a cross-sectional view of a portion of the first pixel PX1; FIG. 8 is a cross-sectional view of a portion of the second pixel PX2; and FIG. 9 is a cross-sectional view of a portion of the third pixel PX3.

Referring to FIG. 7, the fourth insulating layer 15 is disposed on the first pixel circuit, and the first pixel electrode PE1 is disposed on the fourth insulating layer 15. The fifth insulating layer 16 covering the first pixel electrode PE1 and having the first opening OP1 exposing the first light-emitting portion 121a of the first pixel electrode PE1 is disposed on the first pixel electrode PE1. The fifth insulating layer 16 covers an edge of the first region 122a and the second region 125a of the first pixel electrode PE1.

A first light-emitting layer 140a is disposed on the first light-emitting portion 121a of the first pixel electrode PE1 (that is, in the first opening OP1 of the fifth insulating layer 16). A common electrode 160 facing the first pixel electrode PE1 is disposed on the first light-emitting layer 140a. The common electrode 160 may be disposed on the entire surface of the substrate 10 to cover the first light-emitting layer 140a and the fifth insulating layer 16. In an embodiment, the common electrode 160 is made of a conductive material.

In an embodiment, the first region 122a of the first pixel electrode PE1 planarly overlaps with at least a portion of each of the third transistor T3, the first transistor T1, and the capacitor Cst. The first region 122a of the first pixel electrode PE1 may completely overlap with the connection electrode 103 planarly (see X in FIG. 5). In an embodiment, the first region 122a of the first pixel electrode PE1 planarly overlaps with at least one of the source region and the drain region of the third transistor T3. In an embodiment, the second region 125a of the first pixel electrode PE1 planarly overlaps with at least a portion of the sixth transistor T6.

FIG. 7 illustrates the semiconductor layer 101_1 and the gate electrode G1 of the first transistor T1, the semiconductor layer 101_3 and the gate electrode G3 of the third transistor T3, the semiconductor layer 101_6 and the gate electrode G6 of the sixth transistor T6, and the first electrode Cst1 and the second electrode Cst2 of the capacitor Cst.

Referring to FIG. 8, the fourth insulating layer 15 is disposed on the second pixel circuit, and the second pixel electrode PE2 is disposed on the fourth insulating layer 15. The fifth insulating layer 16 covering the second pixel electrode PE2 and having the second opening OP2 exposing the second light-emitting portion 121b of the second pixel electrode PE2 is disposed on the second pixel electrode PE2. The fifth insulating layer 16 covers an edge of the first region 122b and the second region 125b of the second pixel electrode PE2.

A second light-emitting layer 140b is disposed on the second light-emitting portion 121b of the second pixel electrode PE2 (that is, in the second opening OP2 of the fifth insulating layer 16). A common electrode 160 facing the second pixel electrode PE2 is disposed on the second light-emitting layer 140b. The common electrode 160 may be disposed on the entire surface of the substrate 10 to cover the second light-emitting layer 140b and the fifth insulating layer 16.

In an embodiment, the first region 122b of the second pixel electrode PE2 overlaps with at least a portion of the seventh transistor T7. Although not illustrated in FIG. 8, when referring to FIG. 5, in an embodiment, the first region 122b of the second pixel electrode PE2 overlaps with at least a portion of a fourth transistor T4 of a second pixel PX2 of a row adjacent to the second pixel PX2. The second region 125b of the second pixel electrode PE2 overlaps with at least a portion of each of the third transistor T3, the first transistor T1, the capacitor Cst, and the sixth transistor T6. In an embodiment, the second region 125b of the second pixel electrode PE2 overlaps with at least one of the source region and the drain region of the third transistor T3. The second region 125b of the second pixel electrode PE2 may completely overlap with the connection electrode 103 planarly (see Y of FIG. 5).

FIG. 8 illustrates the semiconductor layer 101_1 and the gate electrode G1 of the first transistor T1, the semiconductor layer 101_3 and the gate electrode G3 of the third transistor T3, the semiconductor layer 101_6 and the gate electrode G6 of the sixth transistor T6, the semiconductor layer 101_7 and the gate electrode G7 of the seventh transistor T7, and the first electrode Cst1 and the second electrode Cst2 of the capacitor Cst.

Referring to FIG. 9, the fourth insulating layer 15 is disposed on the third pixel circuit, and the third pixel electrode PE3 is disposed on the fourth insulating layer 15. In an embodiment, the fifth insulating layer 16 covering the third pixel electrode PE3 and having the third opening OP3 exposing the third light-emitting portion 121c of the third pixel electrode PE3 is disposed on the third pixel electrode PE3. The fifth insulating layer 16 covers an edge of the first region 122c and the second region 125c of the third pixel electrode PE3.

A third light-emitting layer 140c is disposed on the third light-emitting portion 121c of the third pixel electrode PE3 (that is, in the third opening OP3 of the fifth insulating layer 16). A common electrode 160 facing the third pixel electrode PE3 is disposed on the third light-emitting layer 140c. The common electrode 160 may be disposed on the entire surface of the substrate 10 to cover the third light-emitting layer 140c and the fifth insulating layer 16.

In an embodiment, the first region 122c of the third pixel electrode PE3 planarly overlaps with at least a portion of each of the third transistor T3, the first transistor T1, and the capacitor Cst. The first region 122c of the third pixel electrode PE3 may completely overlap with the connection electrode 103 planarly (see Z of FIG. 5). The first region 122c of the third pixel electrode PE3 overlaps with at least one of the source region and the drain region of the third transistor T3. In an embodiment, the second region 125c of the third pixel electrode PE3 planarly overlaps with at least a portion of the sixth transistor T6.

FIG. 9 illustrates the semiconductor layer 101_1 and the gate electrode G1 of the first transistor T1, the semiconductor layer 101_3 and the gate electrode G3 of the third transistor T3, the semiconductor layer 101_6 and the gate electrode G6 of the sixth transistor T6, and the first electrode Cst1 and the second electrode Cst2 of the capacitor Cst.

Although not illustrated in FIGS. 7 to 9, an encapsulation substrate or an encapsulation layer may be disposed on the common electrode 160. In an embodiment, the encapsulation layer or substrate is an inorganic material. For example, the inorganic material may be a silicon-based material such as silicon-nitride, silicon-oxide, or silicon oxynitride.

According to embodiments of the present inventive concept, the first through third pixel electrodes PE1 through PE3 cover at least a portion of the thin film transistors below the first through third pixel electrodes PE1 through PE3 (for example, the third transistor T3), and planarly overlap with the same. Accordingly, the first through third pixel electrodes PE1 through PE3 may prevent the thin film transistors from being affected by light incident to at least one of the source region and the drain region of the thin film transistors and/or other electrical signals in the vicinity. That is, the first through third pixel electrodes PE1 through PE3 may further enhance operational characteristics of the pixel circuit.

The light-emitting portion of the pixel electrode in FIGS. 5 through 9 may correspond to the pixel illustrated in FIGS. 1 and 2. In an embodiment, an area of the light-emitting portion of the pixel electrode (hereinafter, "light emission area") is proportional to an area of the pixel electrode, and the light emission area of the pixel electrode determines an aperture ratio of the pixel, and thus, the light-emitting portion of the pixel electrode is described as the pixel for convenience of description in the present specification.

In the present specification and the claims of the present disclosure, the term "correspond" is used to indicate elements disposed in a same region from among a plurality of elements according to the context. That is, if a first member "corresponds" to one of a plurality of second members, it means that the one of a plurality of second members is disposed in a same region as the first member. For example, when a first electrode corresponds to one of a plurality of second electrodes, it means that the first electrode and the second electrode corresponding to the first electrode are disposed in a same pixel region.

At least one embodiment of the inventive concept provides a display apparatus capable of displaying high-quality images through optimal pixel arrangement and by minimizing external effects on thin film transistors in the pixels. However, the scope of the present inventive concept is not limited by these effects.

While one or more embodiments have been described with reference to the figures, it will be understood by those of ordinary skill in the art that various changes in form and details may be made therein without departing from the spirit and scope of the inventive concept.

What is claimed is:
1. A display apparatus comprising:
   a first pixel in a first pixel area, the first pixel comprising:
      a first transistor comprising a first semiconductor layer and a first gate electrode;
      a second transistor comprising a second semiconductor layer and a second gate electrode;
      a first connection electrode connected to the second semiconductor layer of the second transistor and the first gate electrode of the first transistor;
      a first pixel electrode electrically connected to the first transistor and including a first region where a first light-emitting layer is disposed and a second region extending from the first region,
      wherein the second region of the first pixel electrode overlaps the second gate electrode of the second transistor.

2. The display apparatus of claim 1, wherein the second region of the first pixel electrode overlaps the first connection electrode.

3. The display apparatus of claim 1, further comprising a first capacitor overlapping the first transistor.

4. The display apparatus of claim 3, wherein the second region of the first pixel electrode overlaps the first capacitor.

5. The display apparatus of claim 1, wherein the second region of the first pixel electrode overlaps a via hole.

6. The display apparatus of claim 1, further comprising a data line on a layer between the first gate electrode of the first transistor and the first pixel electrode.

7. The display apparatus of claim 1, further comprising a second pixel in a second pixel area adjacent to the first pixel area, the second pixel comprising:
   a third transistor comprising a third semiconductor layer and a third gate electrode;
   a fourth transistor comprising a fourth semiconductor layer and a fourth gate electrode; and
   a second connection electrode connected to the fourth semiconductor layer of the fourth transistor and the third gate electrode of the third transistor,
   wherein the second connection electrode is spaced apart from the first connection electrode.

8. The display apparatus of claim 7, further comprising a second pixel electrode electrically connected to the third transistor and including a third region where a second light-emitting layer is disposed and a fourth region extending from the third region, wherein the second pixel electrode overlaps the fourth transistor.

9. The display apparatus of claim 8, wherein the second pixel electrode is spaced apart from the first pixel electrode.

10. The display apparatus of claim 8, wherein a size of the first region of the first pixel electrode is different from a size of the third region of the second pixel electrode.

11. The display apparatus of claim 8, wherein an imaginary straight line connecting a center of the first light-emitting layer and a center of the second light-emitting layer is not substantially parallel to a row direction and a column direction.

12. The display apparatus of claim 8, further comprising an insulating layer around the first pixel electrode and the second pixel electrode, wherein the insulating layer comprises a first opening corresponding to the first region of the first pixel electrode and a second opening corresponding to the third region of the second pixel electrode.

13. The display apparatus of claim 12, wherein a shape of the first opening is different from a shape of the second opening of the insulating layer.

14. The display apparatus of claim 8, further comprising a second capacitor overlapping the third transistor.

15. The display apparatus of claim 14, wherein the third region of the second pixel electrode overlaps at least a portion of the second capacitor.

16. The display apparatus of claim 8, wherein the fourth region of the second pixel electrode overlaps a via hole.

* * * * *